US011963346B2

(12) United States Patent
Yu et al.

(10) Patent No.: US 11,963,346 B2
(45) Date of Patent: Apr. 16, 2024

(54) SEMICONDUCTOR STRUCTURE AND PREPARATION METHOD THEREOF

(71) Applicant: CHANGXIN MEMORY TECHNOLOGIES, INC., Hefei (CN)

(72) Inventors: Yexiao Yu, Hefei (CN); Junyi Zhang, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 311 days.

(21) Appl. No.: 17/647,869

(22) Filed: Jan. 13, 2022

(65) Prior Publication Data

US 2022/0320112 A1 Oct. 6, 2022

Related U.S. Application Data

(63) Continuation of application No. PCT/CN2021/106201, filed on Jul. 14, 2021.

(30) Foreign Application Priority Data

Mar. 31, 2021 (CN) .......................... 202110350204.8

(51) Int. Cl.
*H10B 12/00* (2023.01)
*H01L 29/06* (2006.01)
(52) U.S. Cl.
CPC ....... *H10B 12/485* (2023.02); *H01L 29/0649* (2013.01)
(58) Field of Classification Search
CPC ........................... H10B 12/485; H01L 29/0649
See application file for complete search history.

(56) References Cited

U.S. PATENT DOCUMENTS 7,034,408 B1 4/2006 Schloesser
9,356,073 B1 * 5/2016 Kim ................. H01L 21/76897
(Continued)

FOREIGN PATENT DOCUMENTS

CN 207852645 U 9/2018
CN 109411472 A 3/2019
(Continued)

OTHER PUBLICATIONS

International Search Report cited in PCT/CN2021/106201 dated Jan. 12, 2022, 10 pages.

*Primary Examiner* — Dao H Nguyen
(74) *Attorney, Agent, or Firm* — Cooper Legal Group, LLC

(57) ABSTRACT

The present application provides a semiconductor structure and a preparation method thereof, including: a substrate; a trench; a bit line contact structure; a bit line structure; a bit line protection structure, the bit line protection structure including a top dielectric layer and a sidewall structure, the top dielectric layer is located on the bit line structure and forms a laminated structure together with the bit line structure; the sidewall structure covers part of sidewalls of the laminated structure on the substrate, the sidewall structure has a first air gap; an isolation pattern structure, the isolation pattern structure has a second air gap, the isolation pattern structure extends along a second direction, the second direction intersects with the first direction, to form capacitance contact hole between the adjacent bit line protection structures and the adjacent isolation pattern structures.

16 Claims, 9 Drawing Sheets

(56) References Cited

U.S. PATENT DOCUMENTS

| | | | |
|---|---|---|---|
| 10,043,810 B1 | 8/2018 | Ikeda | |
| 10,644,008 B2 | 5/2020 | Lee et al. | |
| 11,239,242 B2* | 2/2022 | Yang | H10B 12/315 |
| 2013/0093093 A1* | 4/2013 | Lee | H10B 12/315 |
| | | | 257/E21.585 |
| 2014/0179102 A1* | 6/2014 | Joung | H10B 12/0335 |
| | | | 438/666 |
| 2014/0299989 A1* | 10/2014 | Lim | H10B 12/0335 |
| | | | 257/751 |
| 2014/0306351 A1* | 10/2014 | Kim | H01L 21/76831 |
| | | | 438/653 |
| 2015/0014759 A1* | 1/2015 | Lee | H01L 21/76843 |
| | | | 257/306 |
| 2015/0056801 A1* | 2/2015 | Park | H01L 21/7682 |
| | | | 438/655 |
| 2018/0040561 A1* | 2/2018 | Kim | H01L 23/5226 |
| 2022/0085158 A1* | 3/2022 | Park | H01L 29/0653 |

FOREIGN PATENT DOCUMENTS

| | | |
|---|---|---|
| CN | 109427788 A | 3/2019 |
| CN | 113097210 A | 7/2021 |

* cited by examiner

-The second direction-

—The second direction—

SEMICONDUCTOR STRUCTURE AND PREPARATION METHOD THEREOF

CROSS-REFERENCE TO RELATED APPLICATIONS

The present application is a continuation application of International Patent Application No. PCT/CN2021/106201, titled "SEMICONDUCTOR STRUCTURE AND PREPARATION METHOD THEREOF" and filed on Jul. 14, 2021, which claims the priority to Chinese Patent Application No. 202110350204.8, titled "SEMICONDUCTOR STRUCTURE AND PREPARATION METHOD THEREOF" and filed to the China National Intellectual Property Administration (CNIPA) on Mar. 31, 2021. The entire contents of International Patent Application No. PCT/CN2021/106201 and Chinese Patent Application No. 202110350204.8 are incorporated herein by reference.

TECHNICAL FIELD

The present application relates to the technical field of semiconductors, and in particular, to a semiconductor structure and a preparation method thereof.

BACKGROUND

Dynamic memory pursues high speed, high integration and low power consumption. Especially in the manufacturing process of dynamic random access memory with key size less than 20 nm, with the miniaturization of semiconductor device structure size, the inductive capacitance and inductive current between bit line structure and capacitance contact hole structure, and between capacitance contact hole structure and capacitance contact hole structure become larger and larger, and the inductive charge effect becomes more and more obvious. Based on the typical $6F^2$ storage structure and considering the electrical aspects, the size of capacitance contact hole is close to the physical limit. How to further reduce the size of capacitance contact hole in semiconductor structure has become an urgent problem to be solved.

SUMMARY

The present application provides a semiconductor structure, comprising:
  a substrate;
  a trench, located in the substrate;
  a bit line contact structure, the bit line contact structure located in the trench, an upper surface of the bit line contact structure is lower than an upper surface of the substrate, the bit line contact structure extends along a first direction;
  a bit line structure, the bit line structure located on the bit line contact structure, and at least partially located in the trench;
  a bit line protection structure, the bit line protection structure comprising a top dielectric layer and a sidewall structure, the top dielectric layer is located on the bit line structure and forms a laminated structure together with the bit line structure, the sidewall structure covers part of sidewalls of the laminated structure on the substrate, the sidewall structure has a first air gap;
  an isolation pattern structure, the isolation pattern structure has a second air gap, the isolation pattern structure extends along a second direction, the second direction intersects with the first direction, to form a capacitance contact hole between the adjacent bit line protection structures and the adjacent isolation pattern structures.

The present application further provides a method for manufacturing a semiconductor structure, comprising:
  providing a substrate;
  forming a trench in the substrate;
  forming a bit line contact structure in the trench, an upper surface of the bit line contact structure being lower than an upper surface of the substrate, the bit line contact structure extending along a first direction;
  forming a bit line structure on the bit line contact structure, at least part of the bit line structure being located in the trench;
  forming a top dielectric layer on the bit line structure, the top dielectric layer forming a laminated structure together with the bit line structure;
  forming a sidewall structure, the sidewall structure covering part of sidewalls of the laminated structure on the substrate, the sidewall structure having a first air gap; the sidewall structure and the top dielectric layer forming a bit line protection structure;
  forming an isolation pattern structure, the isolation pattern structure having a second air gap, the isolation pattern structure extending along a second direction, the second direction intersecting with the first direction, a capacitance contact hole being formed between the adjacent bit line protection structures and the adjacent isolation pattern structures.

BRIEF DESCRIPTION OF THE DRAWINGS

To describe the technical solutions in the embodiments of the present application or in the prior art more clearly, the following briefly describes the accompanying drawings required for describing the embodiments or the prior art. Apparently, the accompanying drawings in the following description show some embodiments of the present application, and a person of ordinary skill in the art may still derive other drawings from these accompanying drawings without creative efforts.

DETAILED DESCRIPTION

Figure 1:
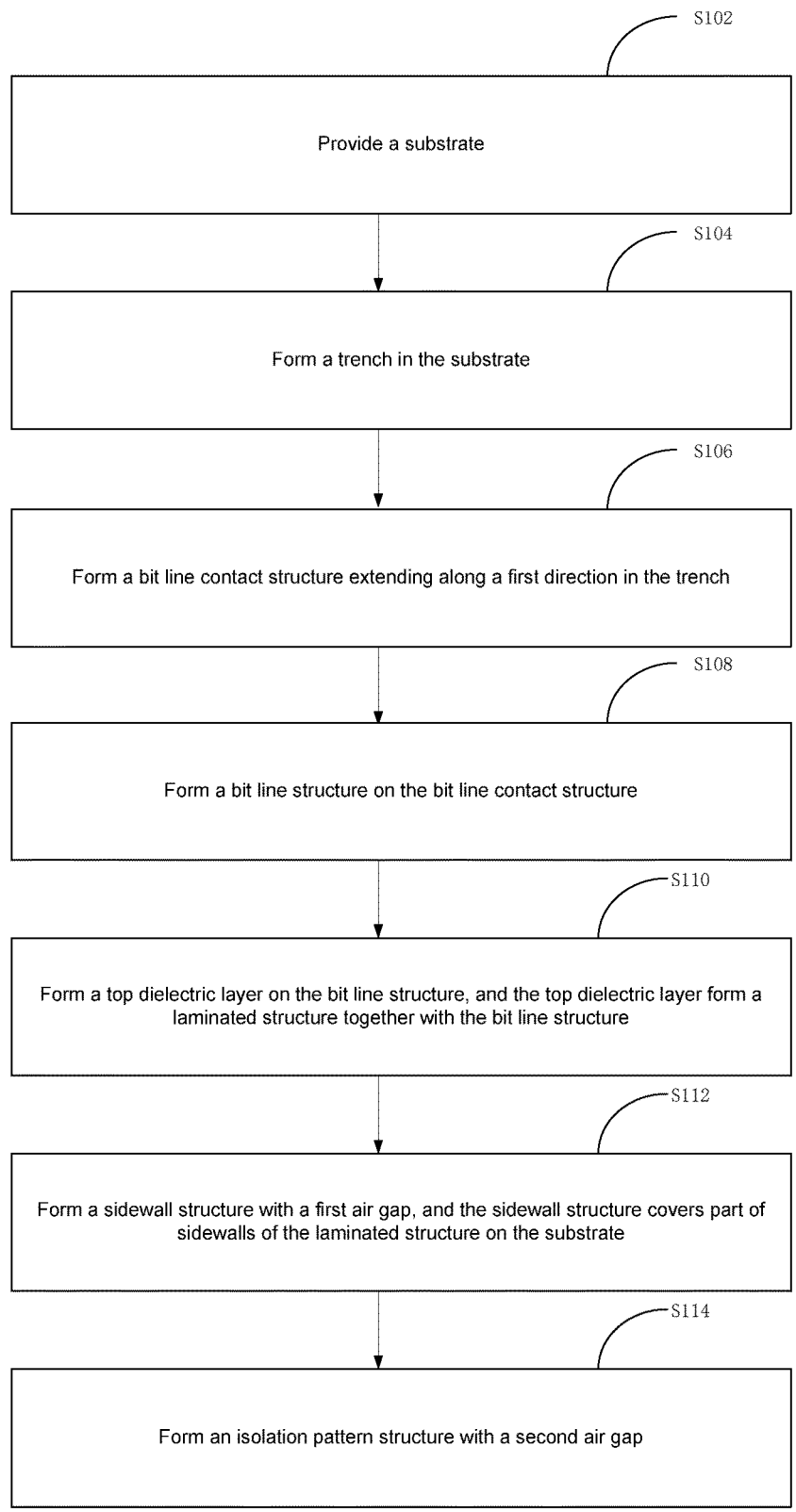
FIG. 1 is a flowchart of a method for manufacturing a semiconductor structure in an embodiment.

For the convenience of understanding the present application, the present application will be described more comprehensively below with reference to the accompanying drawings. The accompanying drawings show preferred embodiments of the present application. However, the present application can be implemented in many different forms and is not limited to the embodiments described herein. On the contrary, the purpose of providing these embodiments is to make the contents disclosed of the present application more thorough and comprehensive.

Unless otherwise defined, all technical and scientific terms used herein have the same meanings as commonly understood by those skilled in the art of the present application. The terms used in the specification of the present application herein are only for the purpose of describing specific embodiments and are not intended to limit the present application.

It should be understood that, when an element or a layer is called "on", "adjacent to", "connected to" or "coupled to" other elements or layers, it may be directly on, adjacent to, connected to or coupled to other elements or layers, or there may be intermediate elements or layers. On the contrary, when an element is called "directly on", "directly adjacent to", "directly connected to" or "directly coupled to" other elements or layers, there is no intermediate element or layer. It should be understood that although the terms first, second, third, etc. may be used to describe various elements, components, regions, layers, doping types and/or parts, these elements, components, regions, layers, doping types and/or parts should not be limited by these terms. These terms are only used to distinguish one element, component, region, layer, doping type or part from another element, component, region, layer, doping type or part. Therefore, without departing from the guidance of the present application, a first element, component, region, layer, doping type or part discussed below may be expressed as a second element, component, region, layer or part; for example, a first doping type may be a second doping type, and similarly, a second doping type may be a first doping type; the first doping type and the second doping type are different doping types, for example, the first doping type can be P-type and the second doping type can be N-type, or the first doping type can be N-type and the second doping type can be P-type.

Spatial relation terms, such as "under", "down", "underlying", "below", "above", "on", etc., can be used to describe the relationship between one element or feature and other elements or features shown in the drawings. It should be understood that in addition to the orientation shown in the drawing, the spatial relation terms further include different orientations of devices in use and operation. For example, if the device in the drawing is reversed, element or feature described as "under other elements" or "under it" or "under" will be oriented "above" other elements or features. Therefore, the exemplary terms "down" and "under" may include above and under orientations. In addition, the device may further include another orientation (e.g., 90 degrees of rotation or other orientation), and the spatial description used herein is interpreted accordingly.

When used herein, the singular forms of "a", "one" and "the" may further include the plural forms unless the context clearly indicates another way. It should also be understood that when the terms "comprise" and/or "include" are used in this specification, the existence of the features, integers, steps, operations, elements and/or components can be determined, but the existence or addition of one or more other features, integers, steps, operations, elements, components and/or groups is not excluded. Meanwhile, when used herein, the term "and/or" includes any and all combinations of the relevant listed items.

The embodiments of the present application are described here with reference to cross-sectional views as schematic diagrams of the embodiments (and intermediate structures) of the present application, in this way, changes in the shown shapes due to, for example, manufacturing technology and/or tolerance can be expected. Therefore, the embodiments of the present application should not be limited to the specific shapes of the regions shown here, but include shape deviations due to, for example, manufacturing technology. For example, an implanted region displayed as a rectangle usually has circular or curved feature and/or implanted concentration gradient at its edge, rather than binary change from the implanted region to the non-implanted region. Similarly, the buried region formed by implantation can lead to some implantation in the region between the buried region and the surface through which the implantation is carried out. Therefore, the regions shown in the drawings are essentially schematic, their shapes do not represent the actual shapes of the regions of the device, and do not limit the scope of the present application.

It should be understood that although the steps in the flowchart of FIG. 1 are displayed in order as indicated by the arrows, these steps are not necessary executed in order as indicated by the arrows. Unless explicitly stated herein, there is no strict sequence restriction on the execution of these steps, and these steps can be executed in other sequences. Further, at least part of the steps in FIG. 1 may include a plurality of steps or stages, these steps or stages are not necessarily executed at the same time, but can be executed at different times, the execution sequence of these steps or stages is not necessarily sequential, but can be executed in turn or alternately with other steps or at least part of the steps or stages in other steps.

FIG. 1 is a flowchart of a method for manufacturing a semiconductor structure in an embodiment.

In order to solve the problems in the prior art, in one embodiment, the present application provides a method for manufacturing a semiconductor structure, as shown in FIG. 1, the method comprises:

S102, provide a substrate.

The substrate can use undoped monocrystalline silicon, monocrystalline silicon doped with impurities, silicon-on-insulator (SOI), strained-silicon-on-insulator (SSOI), strained-SiGe-on-insulator (S—SiGeOI), SiGe-on-insulator (SiGeOI), and germanium-on-insulator (GeOI). As an example, in this embodiment, the constituent material of the substrate is monocrystalline silicon.

S104, form a trench in the substrate.

S106, form a bit line contact structure extending along a first direction in the trench.

Form a bit line contact structure extends along a first direction in the trench, and an upper surface of the bit line contact structure is lower than an upper surface of the substrate.

S108, form a bit line structure on the bit line contact structure.

Form a bit line structure on the bit line contact structure, and at least part of the bit line structure is located in the trench.

S110, form a top dielectric layer on the bit line structure, and the top dielectric layer form a laminated structure together with the bit line structure.

S112, form a sidewall structure with a first air gap, and the sidewall structure covers part of sidewalls of the laminated structure on the substrate.

Form a sidewall structure on part of sidewalls of the laminated structure on the substrate, that is, a sidewall structure is formed on the sidewalls of the laminated structure, and the lower surface of the sidewall structure is flush with the upper surface of the substrate. The sidewall structure has a first air gap, and the sidewall structure and the top dielectric layer form the bit line protection structure.

S114, form an isolation pattern structure with a second air gap.

Form an isolation pattern structure on the substrate, and the isolation pattern structure has a second air gap, the isolation pattern structure extends along a second direction, the second direction intersects with the first direction, and a capacitance contact hole is formed between adjacent bit line protection structures and adjacent isolation pattern structures, that is, the capacitor contact hole is surrounded by adjacent bit line protection structures and adjacent isolation pattern structures.

The method for manufacturing a semiconductor structure above, a bit line structure at least partially located in the trench is formed in the trench on the substrate, the bit line structure extends along the first direction, and the bit line structure form a laminated structure together with the top dielectric layer, part of sidewalls of the laminated structure on the substrate is covered with sidewall structure, a first air gap is arranged in the sidewall structure, an isolation pattern structure extending along the second direction is formed in the second direction intersecting the first direction, and a second air gap is arranged in the isolation pattern structure, a capacitance contact hole is formed between adjacent bit line protection structures and adjacent isolation pattern structures, so that the bit line structure and the capacitance contact structure between adjacent bit line structures are separated by the sidewall structure with a first air gap, and the capacitance contact structure and the capacitance contact structure are separated by the isolation pattern structure with a second air gap, and air has good insulation and smaller dielectric coefficient, under the condition that the induced charge effect between the bit line structure and the capacitance contact structure and between the capacitance contact structure and another capacitance contact structure remains unchanged, the size of capacitance contact hole where the capacitance contact structure is located can be further reduced.

Figure 2:
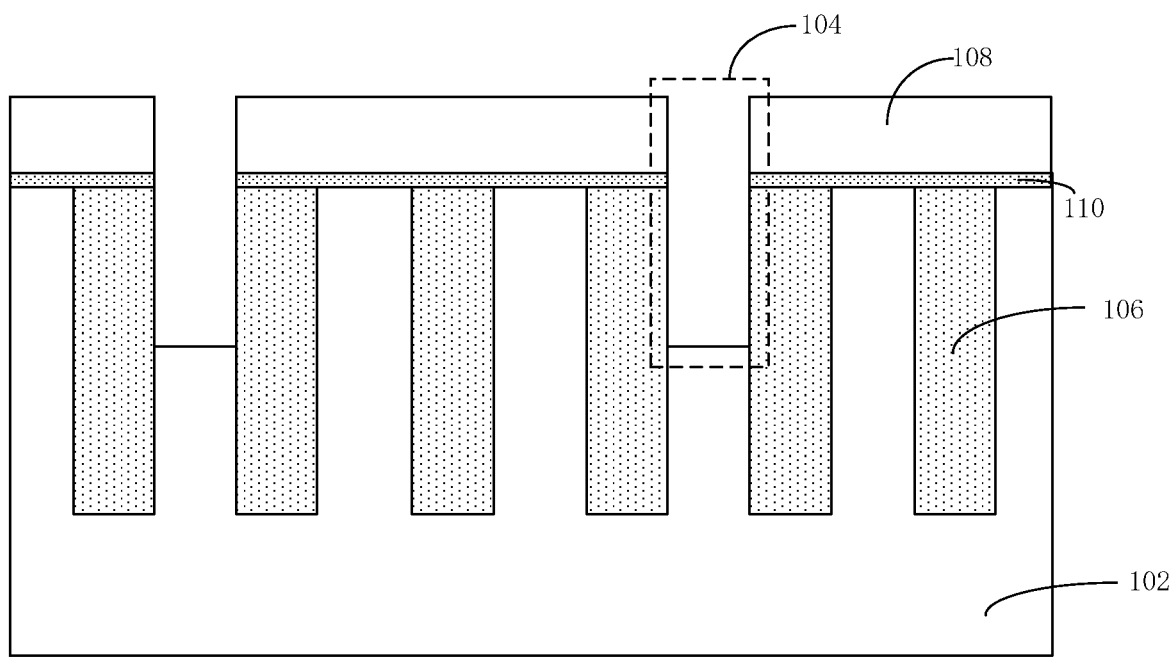
FIG. 2 is a cross-sectional view of a semiconductor structure after a trench is formed in an embodiment.

FIG. 2 is a cross-sectional view of a semiconductor structure after a trench is formed in an embodiment.

As shown in FIG. 2, a trench 104 is formed in a substrate 102, specifically, an isolation structure 106 configured to isolate active regions is formed in the substrate 102, first, a bit line mask pattern 108 is formed on the substrate 102, and the bit line mask pattern 108 exposes part of the substrate 102 corresponding to trench preset region. Then, a trench 104 exposing the active regions in the substrate 102 below the trench preset region is formed in the trench preset region by an etching process, that is, the trench 104 exposes the active regions in the substrate 102.

In one embodiment, before forming the trench 104, it further comprises a step of forming a barrier layer 110 on the substrate 102, such as the barrier layer 110 comprising a silicon nitride layer, and the step of forming the trench 104 by etching further comprises etching and removing part of the barrier layer 110 below the trench preset region.

Figure 3:
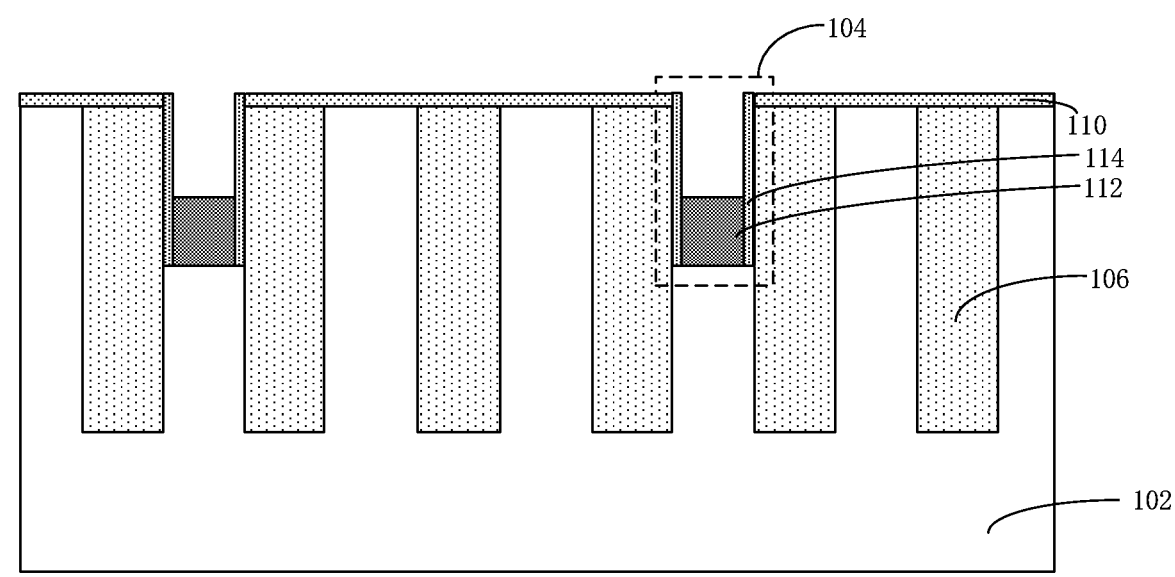
FIG. 3 is a cross-sectional view of a semiconductor structure after a bit line contact structure is formed in an embodiment.

FIG. 3 is a cross-sectional view of a semiconductor structure after a bit line contact structure is formed in an embodiment;

As shown in FIG. 3, a bit line contact structure 112 is formed in the trench 104, the lower surface of the bit line contact structure 112 contacts the active regions in the substrate 102, and the bit line contact structure 112 extends in the first direction. Specifically, first, the trench 104 is filled with a bit line contact material layer, and the bit line contact material layer fills the trench 104 and covers the substrate 102. For example, the upper surface of the bit line contact material layer at the positions of the trench 104 is higher than the upper surface of the substrate 102, and then a planarization process is performed by chemical mechanical polishing (CMP), excess part of the bit line contact material layer on the substrate 102 and in the trench 104 are etched back and removed to obtain a bit line contact structure 112 with an upper surface lower than the upper surface of the substrate 102. In some embodiments, the bit line contact structure 112 comprises polysilicon structure.

As shown in FIG. 3, in one embodiment, before forming the bit line contact structure 112 in the trench 104, the method further comprises:

A sidewall protective layer 114 is formed on the sidewalls of the trench 104, that is, the sidewall protective layer 114 is formed between the bit line contact structure 112 and the sidewalls of the trench 104, in some embodiment, the upper surface of the sidewall protective layer 114 is flush with the upper surface of the substrate 102.

Specifically, first, a sidewall protective material layer is formed on the substrate 102, and the sidewall protective material layer covers the bottom and sidewalls of the trench 104 and extends along the sidewalls of the trench 104 to cover the substrate 102. Then, part of the sidewall protective material layer on the bottom of the trench 104 and on the substrate 102 are removed by an etching process to obtain a sidewall protective layer 114 composed of the remaining part of the sidewall protective material layer on the sidewalls of the trench 104. In some embodiments, the part of the sidewall protective material layer on the bottom of the trench 104 and on the substrate 102 are removed by a dry etching process, such as a dry etching process in which the process gas comprises chlorine. In some embodiments, the sidewall protective layer 114 comprises TiN layer.

Figure 4:
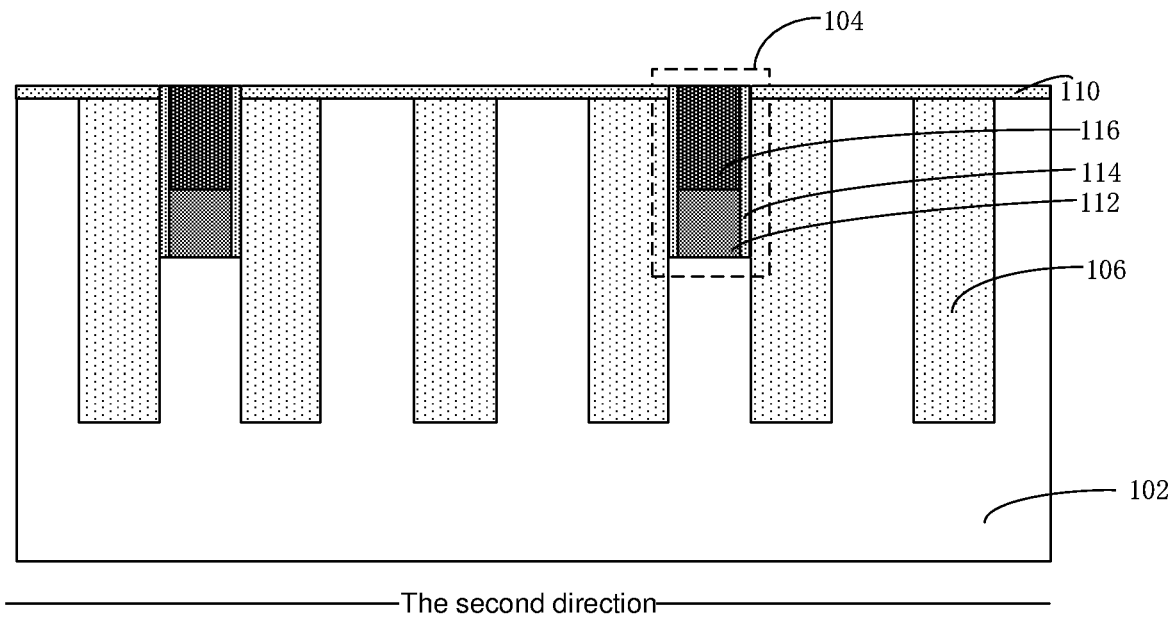
FIG. 4 is a cross-sectional view of a semiconductor structure after a bit line structure is formed in an embodiment.

FIG. 4 is a cross-sectional view of a semiconductor structure after a bit line structure is formed in an embodiment;

As shown in FIG. 4, a bit line structure 116 is formed on the bit line contact structure 112, and at least part of the bit line structure 116 is located in the trench 104. Specifically, a bit line material layer is filled in the trench 104, and the upper surface of the bit line material layer in the trench 104 is higher than the upper surface of the substrate 102. Then, the surface of the bit line material layer is performed planarization by CMP process. Then, excess part of the bit line material layer on the surface of the substrate 102 is removed to obtain a bit line structure 116 composed of the remaining part of the bit line material layer on the bit line contact structure 112. For example, the bit line structure 116 is a bit line structure made of tungsten.

In one embodiment, chemical mechanical polishing is performed to remove the bit line material layer up to the barrier layer 110 on the surface of the substrate 102.

In one embodiment, the upper surface of the bit line structure 116 is flush with the upper surface of the substrate 102. In other embodiments, the upper surface of the bit line structure 116 is higher than the upper surface of the substrate 102. The technical solutions of the present application are described below with the upper surface of the bit line structure 116 being flush with the upper surface of the substrate 102.

Figure 5:
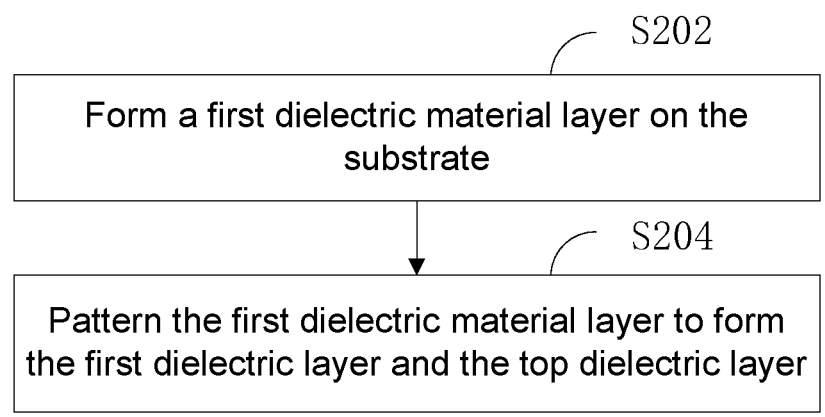
FIG. 5 is a flowchart of forming top a dielectric layer and a first dielectric layer in an embodiment.
Figure 6:
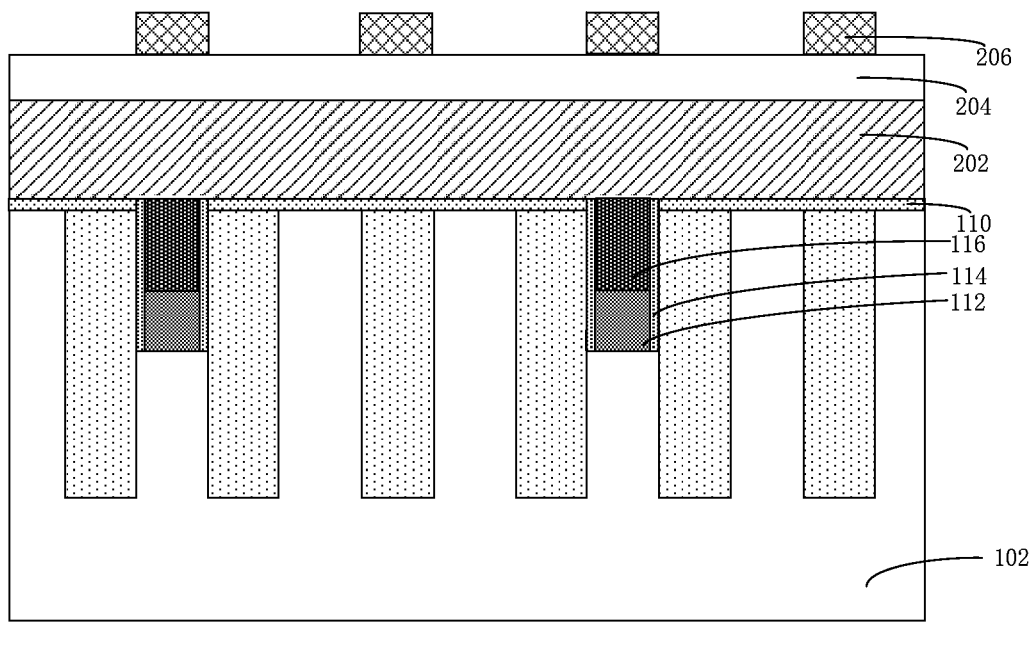
FIG. 6 is a cross-sectional view of a semiconductor structure after a first dielectric material layer is formed in an embodiment.
Figure 7:
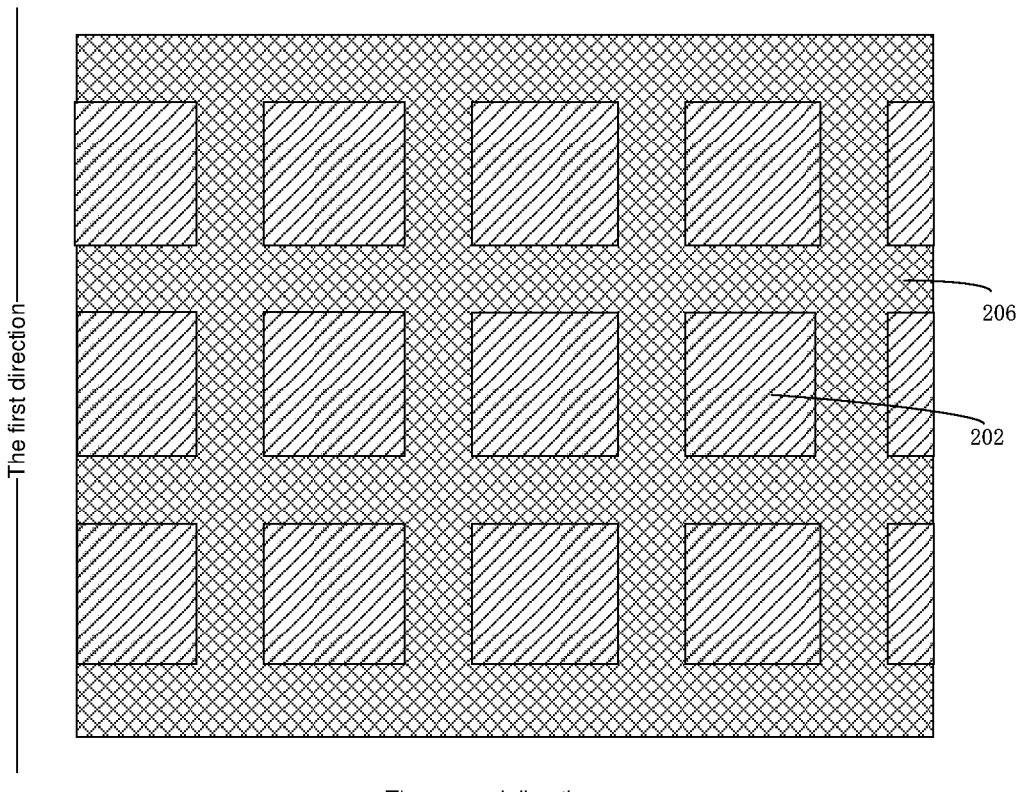
FIG. 7 is a schematic diagram of a projection of a top view corresponding to FIG. 6 on a surface of a first dielectric material layer in an embodiment.
Figure 8:
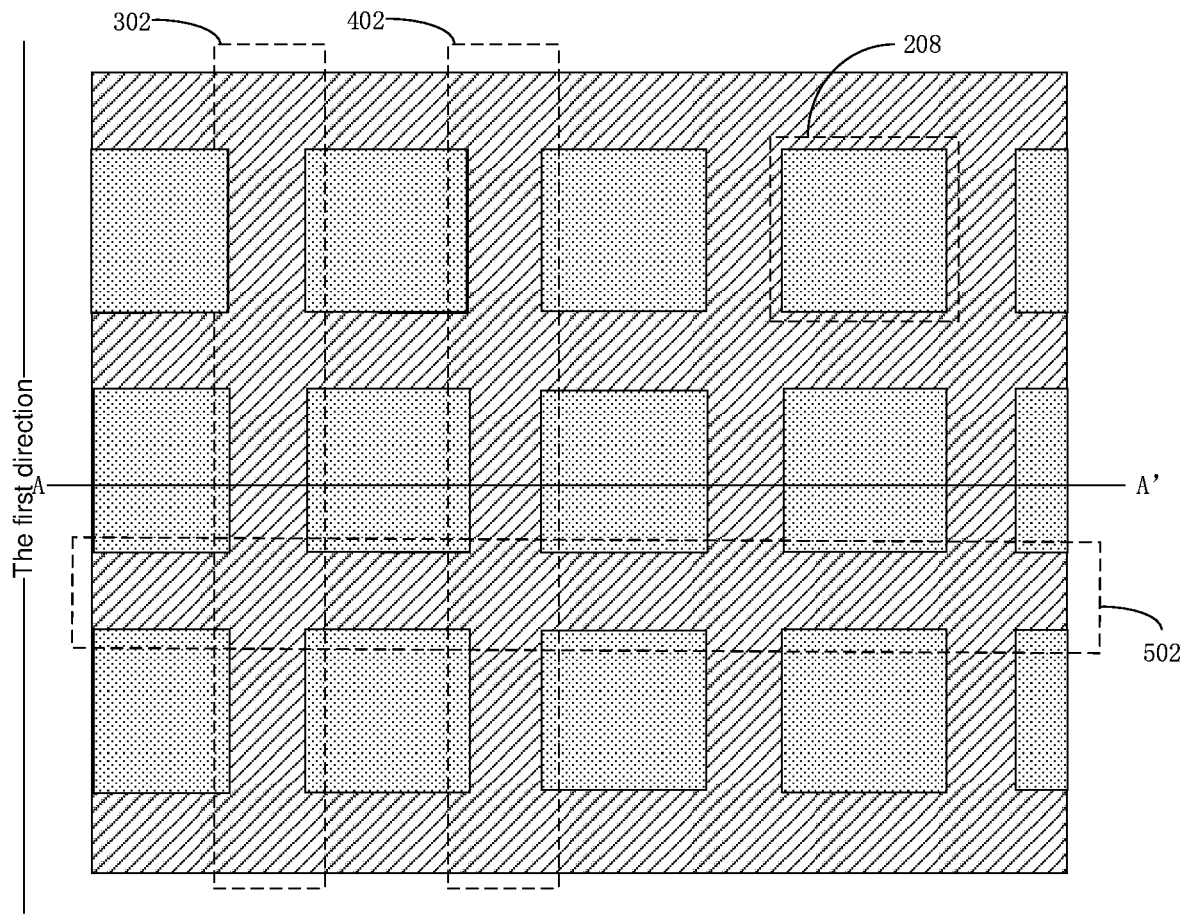
FIG. 8 is a top view of a semiconductor structure after a top dielectric layer and a first dielectric layer are formed in an embodiment.
Figure 9:
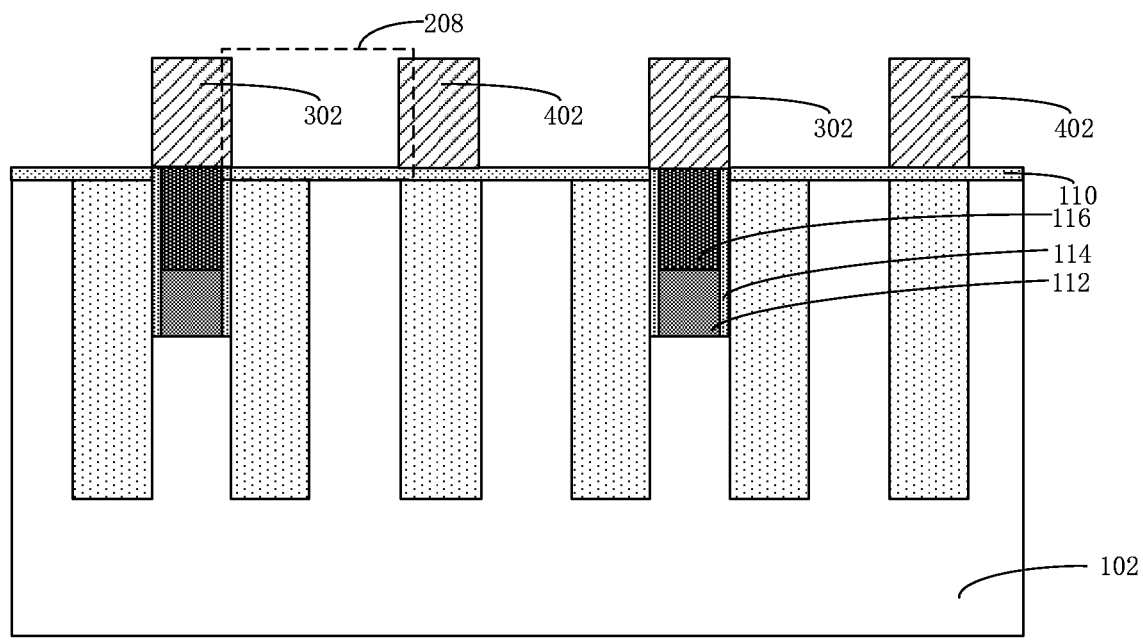
FIG. 9 is a cross-sectional view along an AA' direction corresponding to FIG. 8 in an embodiment.

FIG. 5 is a flowchart of forming a top dielectric layer and a first dielectric layer in an embodiment. FIG. 6 is a cross-sectional view of a semiconductor structure after a first dielectric material layer is formed in an embodiment. FIG. 7 is a schematic diagram of a projection of a top view corresponding to FIG. 6 on a surface of a first dielectric material layer in an embodiment. FIG. 8 is a top view of a semiconductor structure after a top dielectric layer and a first dielectric layer are formed in an embodiment. FIG. 9 is a cross-sectional view along an AA' direction corresponding to FIG. 8 in an embodiment.

As shown in FIG. 5, in one embodiment, a first dielectric layer is formed while a top dielectric layer is formed, and the first dielectric layer extends along the second direction; the steps of forming the top dielectric layer and the first dielectric layer comprise:

S202, form a first dielectric material layer on the substrate.

In one embodiment, the first dielectric material layer comprises a silicon nitride material layer.

S204, pattern the first dielectric material layer to form the first dielectric layer and the top dielectric layer.

In one embodiment, while forming the top dielectric layer, an isolation dielectric layer is also formed. The isolation dielectric layer is located on part of the substrate between adjacent bit line protection structures and extends along the first direction. The capacitance contact hole is formed between adjacent bit line protection structure and isolation dielectric layer and adjacent first dielectric layer, that is, a capacitance contact hole is surrounded by adjacent bit line protection structure and isolation dielectric layer and adjacent first dielectric layer. That is, the top dielectric layer, the first dielectric layer and the isolation dielectric layer are different part composed of the remaining part of the first dielectric material layer obtained after patterning the first dielectric material layer.

As shown in FIG. 6, in one embodiment, after forming the first dielectric material layer 202 on the substrate, the method further comprises a step of forming a contact mask layer 204 on the first dielectric material layer 202.

Specifically, as shown in FIGS. 6-9, firstly, a first dielectric material layer 202, a contact mask layer 204 and a photoetching mask pattern 206 are successively formed on the substrate 102, and the photoetching mask pattern 206 exposes part of the contact mask layer 204 in the contact hole preset region, secondly, the photoetching mask pattern 206 is transferred to the contact mask layer 204 to obtain the contact mask pattern exposing the contact hole preset region, and the photoetching mask pattern 206 is removed, then, part of the first dielectric material layer 202 not covered by the contact mask pattern are etched and removed to form a capacitance contact hole 208, a top dielectric layer 302 and an isolation dielectric layer 402 extending along the first direction, and a first dielectric layer 502 extending along the second direction, and then remove the contact mask pattern, wherein a capacitance contact hole 208 is surrounded by adjacent top dielectric layer 302 and isolation dielectric layer 402 and adjacent first dielectric layers 502.

Figure 10:
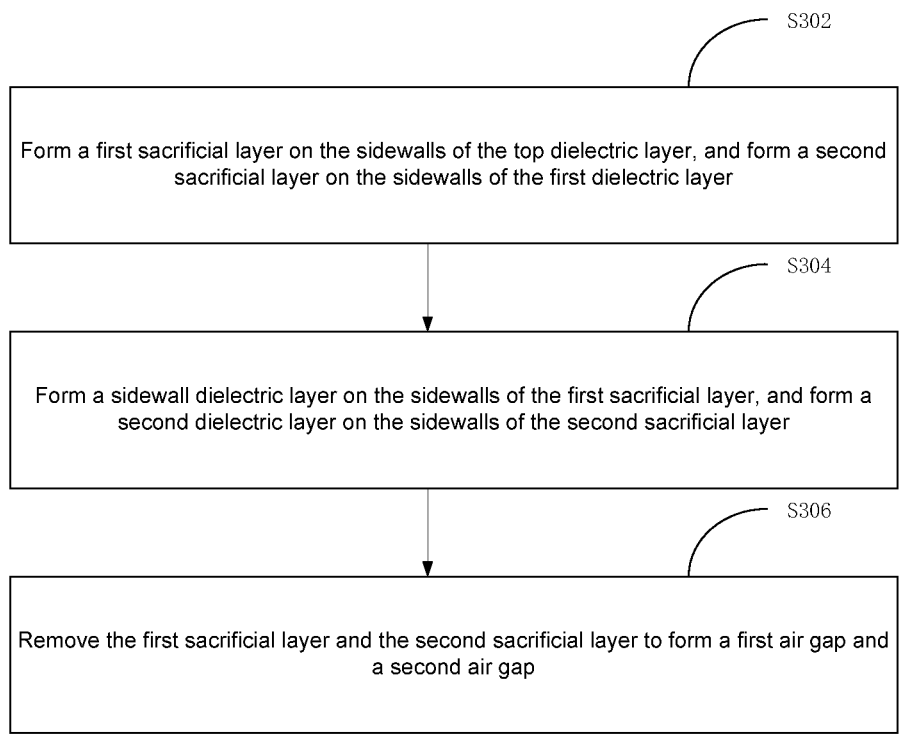
FIG. 10 is a flowchart of forming a sidewall structure and a isolation pattern structure in an embodiment.
Figure 11:
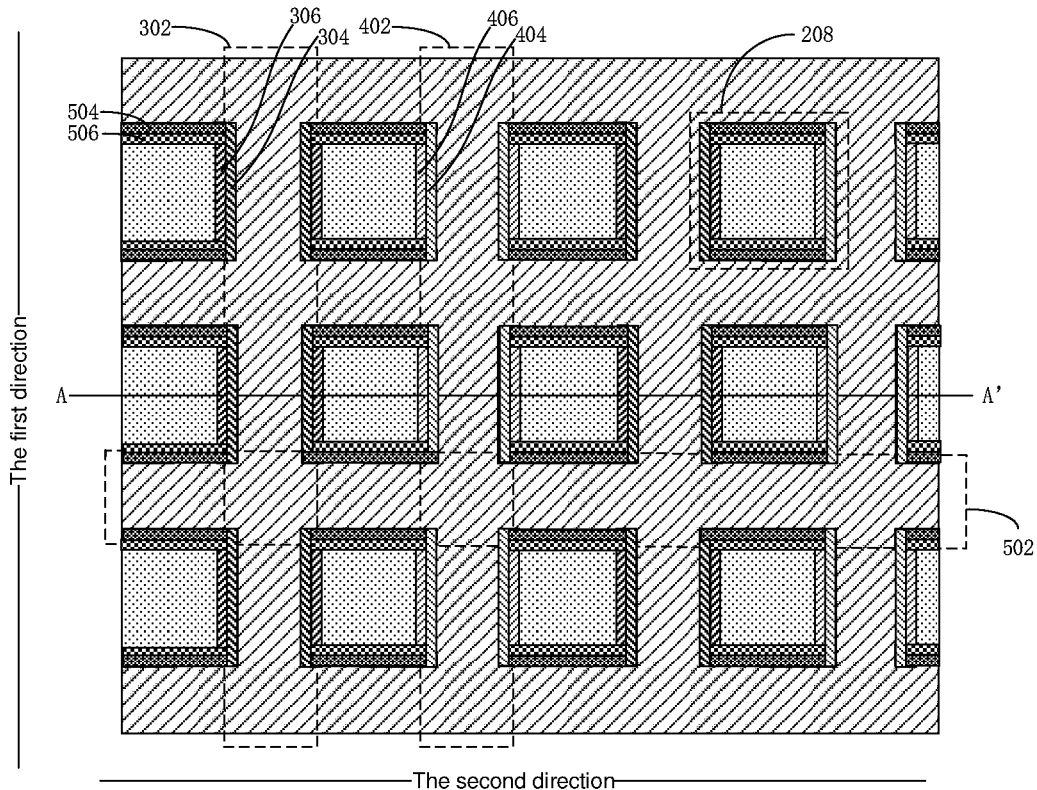
FIG. 11 is a top view of a semiconductor structure after step S304 in an embodiment.
Figure 12:
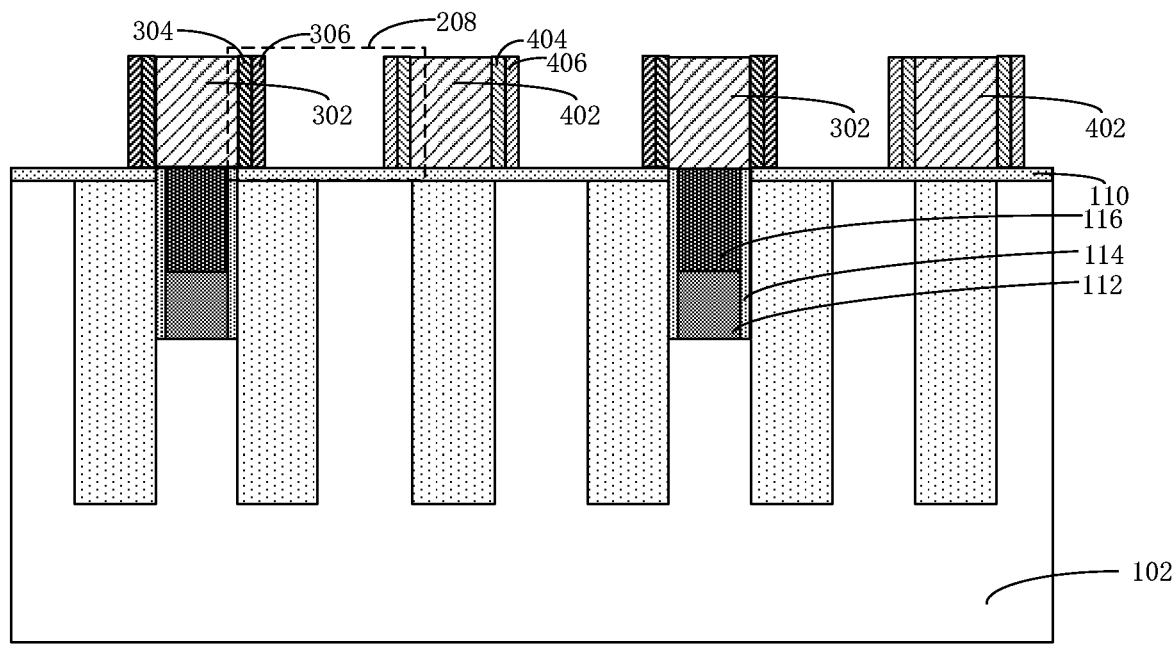
FIG. 12 is a cross-sectional view along an AA' direction corresponding to FIG. 11 in an embodiment.
Figure 13:
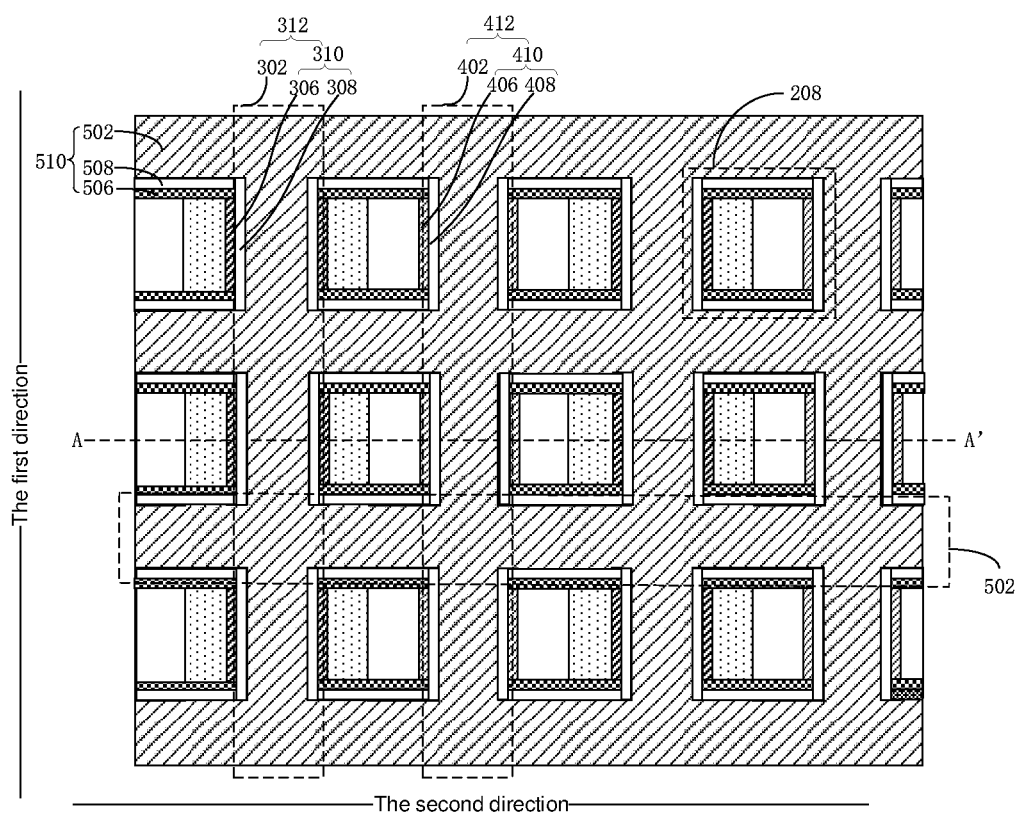
FIG. 13 is a top view of a semiconductor structure after step S306 corresponding to FIG. 11 in an embodiment.
Figure 14:
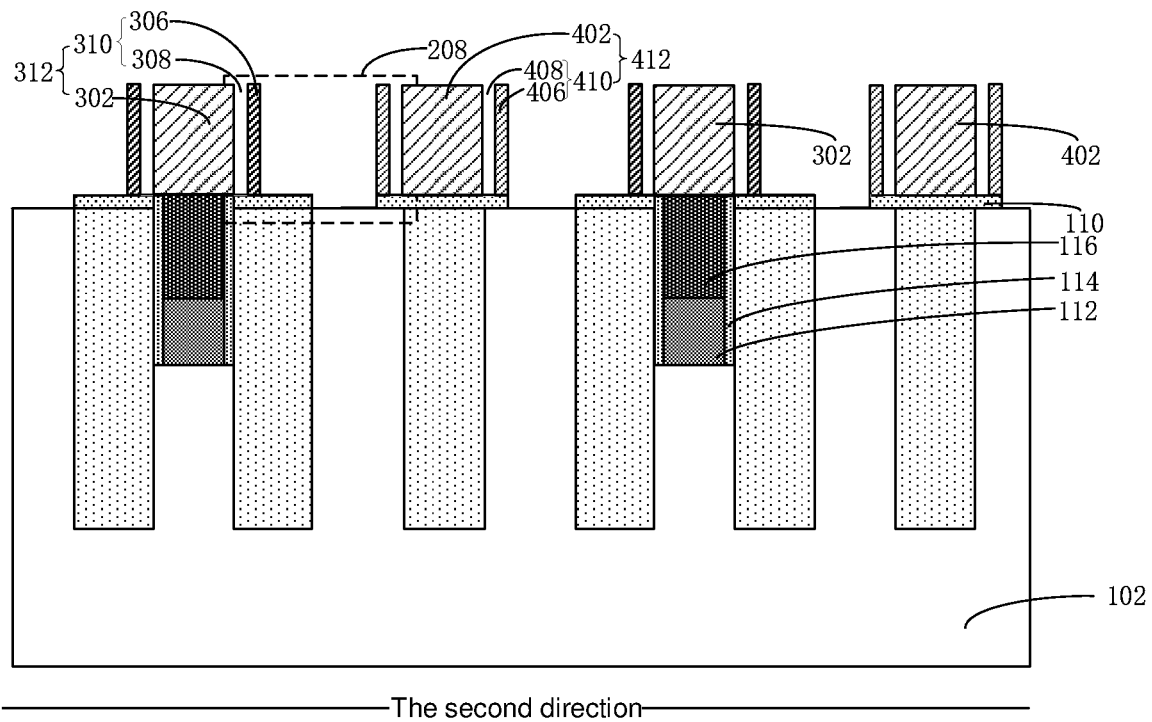
FIG. 14 is a cross-sectional view along an AA' direction corresponding to FIG. 13 in an embodiment.

FIG. 10 is a flowchart of forming a sidewall structure and an isolation pattern structure in an embodiment. FIG. 11 is a top view of a semiconductor structure after step S304 in an embodiment. FIG. 12 is a cross-sectional view along an AA' direction corresponding to FIG. 11 in an embodiment. FIG. 13 is a top view of a semiconductor structure after step S306 corresponding to FIG. 11 in an embodiment. FIG. 14 is a cross-sectional view along an AA' direction corresponding to FIG. 13 in an embodiment.

As shown in FIG. 10, FIG. 11, FIG. 12, FIG. 13 and FIG. 14, in one embodiment, a sidewall structure and an isolation pattern structure are formed at the same time. The steps of forming the sidewall structure and the isolation pattern structure comprise:

S302, form a first sacrificial layer on the sidewalls of the top dielectric layer, and form a second sacrificial layer on the sidewalls of the first dielectric layer.

Specifically, a first sacrificial layer 304 is formed on the sidewalls of the top dielectric layer 302, and a second sacrificial layer 504 is formed on the sidewalls of the first dielectric layer 502, that is, the first sacrificial layer 304 is formed on sidewalls of the capacitance contact hole 208 close to the top dielectric layer 302, and the second sacrificial layer 504 is formed on sidewalls of the capacitance contact hole 208 close to the first dielectric layer 502. Typically, the upper surfaces of the first sacrificial layer 304 and the second sacrificial layer 504 are flush with the upper surface of the top dielectric layer 302, and the lower surfaces of the first sacrificial layer 304 and the second sacrificial layer 504 are flush with the upper surface of the substrate 102, that is, the first sacrificial layer 304 and the second sacrificial layer 504 cover the sidewalls of the top dielectric layer 302 and the part of the sidewalls of the bit line structure 116 located on the substrate 102. In one embodiment, both the first sacrificial layer 304 and the second sacrificial layer 504 are silicon oxide layers.

In one embodiment, while forming the first sacrificial layer 304 and the second sacrificial layer 504, third sacrificial layer 404 is also formed on the sidewalls of the isolation dielectric layer 402, that is, the third sacrificial layer 404 is formed on sidewalls of the capacitance contact hole 208 close to the isolation dielectric layer 402, the upper surface of the third sacrificial layer 404 is flush with the upper surface of the top dielectric layer 302. In one embodiment, the third sacrificial layer 404 is silicon oxide layer.

In one embodiment, before step S302, the method further comprises steps of forming third dielectric layer on the sidewalls of the top dielectric layer 302 and fourth dielectric layer on the sidewalls of the first dielectric layer 502, that is, the third dielectric layer is formed between the first sacrificial layer 304 and the sidewalls of the capacitance contact hole 208, the fourth dielectric layer is formed between the second sacrificial layer 504 and the sidewalls of the capacitance contact hole 208. In one embodiment, both the third dielectric layer and the fourth dielectric layer are silicon nitride dielectric layers.

In one embodiment, while forming the third dielectric layer on the sidewalls of the top dielectric layer 302 and forming the fourth dielectric layer on the sidewalls of the first dielectric layer 502, a fifth dielectric layer is also formed on the sidewalls of the isolation dielectric layer 402, that is, the fifth dielectric layer is formed between the isolation dielectric layer 402 and the sidewalls of the capacitance contact hole 208. In one embodiment, the fifth dielectric layer is silicon nitride dielectric layer.

S304, form a sidewall dielectric layer on the sidewalls of the first sacrificial layer, and form a second dielectric layer on the sidewalls of the second sacrificial layer.

Specifically, the sidewall dielectric layer 306 (e.g., silicon nitride dielectric layer) is formed on the sidewalls of the first sacrificial layer 304, and the second dielectric layer 506 (e.g., silicon nitride dielectric layer) is formed on the sidewalls of the second sacrificial layer 504, wherein, the upper surfaces of the sidewall dielectric layer 306 and the second dielectric layer 506 are flush with the upper surface of the top dielectric layer 302.

In one embodiment, while forming the sidewall dielectric layer 306 and the second dielectric layer 506, a sixth dielectric layer 406 (e.g., silicon nitride dielectric layer) is also formed on the sidewalls of the third sacrificial layer 404.

S306, remove the first sacrificial layer and the second sacrificial layer to form a first air gap and a second air gap.

Specifically, while removing the first sacrificial layer 304 between the sidewall dielectric layer 306 and the top dielectric layer 302 to form the first air gap 308, the second sacrificial layer 504 between the second dielectric layer 506 and the first dielectric layer 502 is removed to form the second air gap 508, wherein, the first air gap 308 and the sidewall dielectric layer 306 form a sidewall structure 310, the sidewall structure 310 and the top dielectric layer 302 form the bit line protection structure 312; and the first dielectric layer 502, the second air gap 508 and the second dielectric layer 506 form the isolation pattern structure 510.

When the third dielectric layer is formed between the first sacrificial layer 304 and the sidewalls of the capacitance contact hole 208, and the fourth dielectric layer is formed between the second sacrificial layer 504 and the sidewalls of the capacitance contact hole 208, the sidewall structure 310 comprises the third dielectric layer, and the isolation pattern structure 510 comprises the fourth dielectric layer.

In one embodiment, while removing the first sacrificial layer 304 and the second sacrificial layer 504 to form the first air gap 308 and the second air gap 508, the third sacrificial layer 404 is removed to form the third air gap 408, wherein, the third air gap 408 and the sixth dielectric layer 406 form an isolation sidewall structure 410, the isolation sidewall structure 410 and the isolation dielectric layer 402 form an isolation dielectric structure 412 located between adjacent the bit line protection structures 312. When the fifth dielectric layer is formed between the third sacrificial layer 404 and the sidewalls of the capacitance contact hole 208, the isolation sidewall structure 410 comprises the fifth dielectric layer.

In one embodiment, the method for manufacturing the semiconductor structure further comprises: part of the barrier layer 110 above the active regions in the substrate 102 is etched and removed, so that the capacitance contact hole 208 exposes the active regions in the lower substrate, so as to realize the electrical connection between the subsequently formed capacitance contact structures and the active regions.

Figure 15:
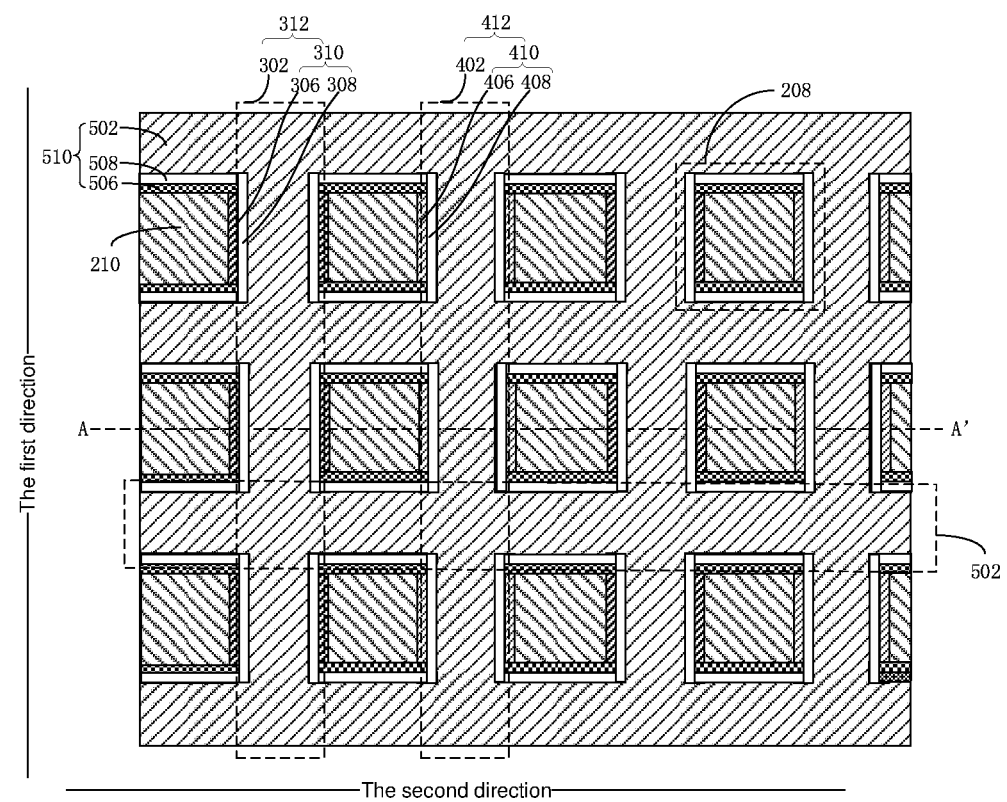
FIG. 15 is a top view of a semiconductor structure after a capacitance contact structure is formed in an embodiment.
Figure 16:
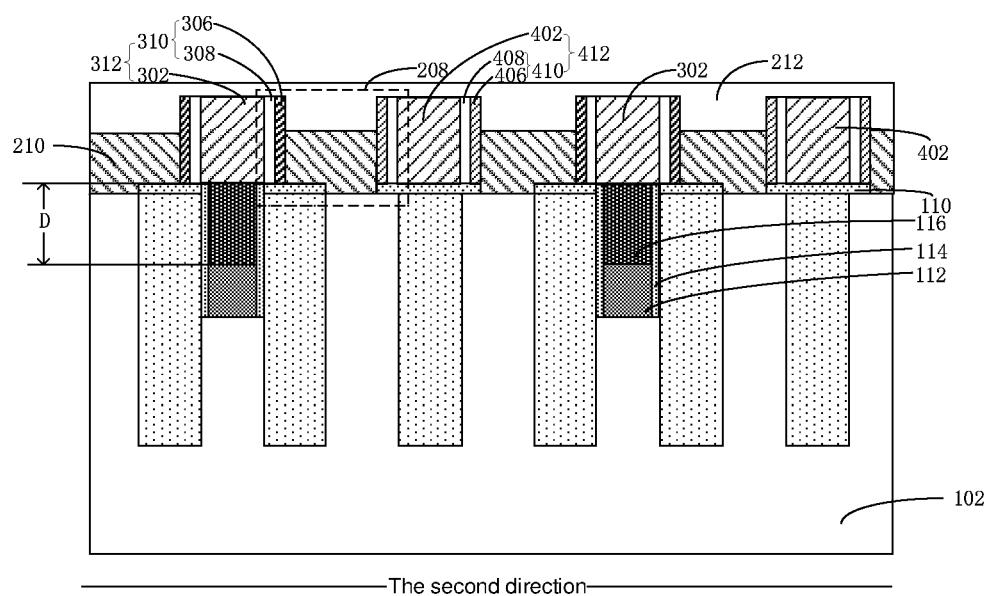
FIG. 16 is a cross-sectional view of a semiconductor structure corresponding to FIG. 15 along an AA' direction after a conductive filling layer is formed in an embodiment.

FIG. 15 is a top view of a semiconductor structure after capacitance contact structures are formed in an embodiment. FIG. 16 is a cross-sectional view of a semiconductor structure corresponding to FIG. 15 along an AA' direction after a conductive filling layer is formed in an embodiment.

As shown in FIG. 15 and FIG. 16, in one embodiment, after forming the sidewall structure 310 and the isolation pattern structure 510, the method further comprises: forming a capacitance contact structure in the capacitance contact hole. By setting the upper surface of the bit line contact structure 112 lower than the upper surface of the substrate 102, such that at least part of the bit line structure 116 is located in the trench 104. When the thickness D of the bit line structure 116 remains unchanged, the depth of the capacitance contact hole 208 to be filled becomes smaller, which greatly improves the filling effect of the capacitance contact structure.

Specifically, the capacitance contact structure 210 is formed in the capacitance contact hole 208 surrounded by the adjacent bit line protection structures 312 and the adjacent isolation pattern structures 510, which is in electrical contact with the active regions in the substrate 102 after forming the sidewall structure 310 and the isolation pattern structure 510, and the material of the capacitance contact structure 210 comprises a polysilicon structure.

In one embodiment, the upper surface of the capacitance contact structure 210 is not lower than the upper surface of the top dielectric layer 302.

As shown in FIG. 15 and FIG. 16, in one embodiment, the upper surface of the capacitance contact structure 210 is lower than the upper surface of the top dielectric layer 302. After forming the capacitance contact structure 210, the method further comprises: forming a conductive filling layer 212 on the capacitance contact structure 210, and the conductive filling layer 212 comprises a tungsten filling layer.

As shown in FIG. 3, FIG. 15 and FIG. 16, in one embodiment, the present application provides a semiconductor structure, comprising:
- a substrate 102, and the substrate 102 can use undoped monocrystalline silicon, monocrystalline silicon doped with impurities, SOI, SSOI, S—SiGeOI, SiGeOI, and GeOI. As an example, in this embodiment, the constituent material of the substrate is monocrystalline silicon;
- a trench 104, located in the substrate 102;
- a bit line contact structure 112, the bit line contact structure located in the trench 104, and an upper surface of the bit line contact structure 112 is lower than an upper surface of the substrate 102, the bit line contact structure 112 extends along a first direction;
- a bit line structure 116, the bit line structure 116 located on the bit line contact structure 112, and at least part of the bit line structure 116 located in the trench 104;
- a bit line protection structure 312, the bit line protection structure 312 comprising a top dielectric layer 302 and a sidewall structure 310, the top dielectric layer 302 is located on the bit line structure 116 and forms a laminated structure together with the bit line structure 116, the sidewall structure 310 covers part of sidewalls of the laminated structure on the substrate 102, that is, the sidewall structure 310 covers the sidewalls of the laminated structure, and the lower surface of the sidewall structure 310 is flush with the upper surface of the substrate 102, and the sidewall structure 310 has a first air gap 308;
- an isolation pattern structure 510, the isolation pattern structure 510 has a second air gap 508 and extends along a second direction, and the second direction intersects with the first direction, to form a capacitance contact hole 208 between adjacent bit line protection structures 312 and adjacent isolation pattern structures 510.

In one embodiment, the semiconductor structure further comprises: a barrier layer 110, such as a barrier layer 110 comprising a silicon nitride layer, which is located on the substrate 102, and the capacitance contact structure 210 contacts with the active regions in the substrate 102 through the barrier layer 110.

In one embodiment, the semiconductor structure further comprises: a sidewall protective layer 114, located on the sidewalls of the trench 104, in some embodiments, the upper surface of the sidewall protective layer 114 is flush with the upper surface of the substrate 102. In some embodiments, the sidewall protective layer 114 comprises TiN layer.

In one embodiment, the semiconductor structure further comprises:
  an isolation dielectric structure 412, the isolation dielectric structure located between the adjacent bit line protection structures 312, comprising the isolation dielectric layer 402 and the isolation sidewall structure 410. The isolation dielectric layer 402 is located on the substrate 102, the isolation sidewall structure 410 covers the sidewalls of the isolation dielectric layer 402, the isolation sidewall structure 410 has a third air gap 408, the isolation dielectric structure 412 extends along the first direction, and a capacitance contact hole 208 is formed between the adjacent bit line protection structure 312 and isolation dielectric structure 412 and the adjacent isolation pattern structures 512. In one embodiment, the isolation dielectric layer 402 comprises silicon nitride dielectric layer.

In one embodiment, the isolation sidewall structure 410 comprises: a sixth dielectric layer 406 (e.g., silicon nitride dielectric layer), located outside the sidewalls of the isolation dielectric layer 402, that is, the sixth dielectric layer 406 is located outside the sidewalls of the isolation dielectric layer 402 forming the capacitance contact hole 208, and the third air gap 408 is located between the sixth dielectric layer 406 and the isolation dielectric layer 402, that is, the lower surface of the sixth dielectric layer 406 is flush with the upper surface of the substrate 102.

In one embodiment, the isolation sidewall structure 410 further comprises: a fifth dielectric layer (e.g., silicon nitride dielectric layer), located on the sidewalls of the isolation dielectric layer 402, that is, on the sidewalls of the isolation dielectric layer 402 forming the capacitance contact hole 208.

In one embodiment, the semiconductor structure further comprises a sidewall protective layer 114, covering the sidewalls of the trench 104. In some embodiments, the sidewall protective layer 114 comprises TiN layer.

In one embodiment, the bit line contact structure 112 and the bit line structure 116 fill the trench 104, for example, the bit line contact structure is polysilicon structure, and the bit line structure 116 is a bit line structure made of tungsten.

In one embodiment, the upper surface of the bit line structure 116 is flush with the upper surface of the substrate 102. In other embodiments, the upper surface of the bit line structure 116 is higher than the upper surface of the substrate 102.

In one embodiment, the sidewall structure 310 further comprises:
  a sidewall dielectric layer 306, located outside part of the sidewalls of the laminated structure located on the substrate 102; a first air gap 308 located between the sidewall dielectric layer 306 and the laminated structure, that is, the sidewall dielectric layer 306 is located on the sidewalls of the laminated structure, and the lower surface of the sidewall dielectric layer 306 is flush with the upper surface of the substrate 102. In some embodiment, the sidewall dielectric layer 306 comprises silicon nitride dielectric layer.

In one embodiment, the sidewall structure 310 further comprises: a third dielectric layer, located outside part of the sidewalls of the laminated structure located on the substrate 102, that is, the third dielectric layer is located on the sidewalls of the laminated structure forming the capacitance contact hole 208, that is, the first air gap 308 is located between the sidewall dielectric layer 306 and the third dielectric layer. In one embodiment, the third dielectric layer comprises silicon nitride dielectric layer.

In one embodiment, the semiconductor structure further comprises:
  a capacitance contact structure 210, the capacitance contact structure 210 located in the capacitance contact hole 208, the material of the capacitance contact structure 210 comprises a polysilicon.

In one embodiment, the isolation pattern structure 510 further comprises:
  a first dielectric layer 502;
  a second dielectric layer 506, located on the opposite sides of the first dielectric layer 502; a second air gap 508 located between the first dielectric layer 502 and the second dielectric layer 506.

In one embodiment, the isolation pattern structure 510 further comprises: a fourth dielectric layer, located on the opposite sides of the first dielectric layer 502, that is, the fourth dielectric layer is located on the sidewalls of the first dielectric layer 502 forming the capacitance contact hole 208, and the second air gap 508 is located between the fourth dielectric layer and the second dielectric layer 506. In one embodiment, the fourth dielectric layer comprises silicon nitride dielectric layer.

In one embodiment, the upper surface of the capacitance contact structure 210 is not lower than the upper surface of the top dielectric layer 302.

In one embodiment, the upper surface of the capacitance contact structure 210 is lower than the upper surface of the top dielectric layer 302, and the semiconductor structure further comprises a conductive filling layer 212, located on the capacitance contact structure 210, and the conductive filling layer 212 comprises a filling layer made of tungsten.

In one embodiment, the first dielectric layer 502, the top dielectric layer 302 and the second dielectric layer 506 all comprise silicon nitride dielectric layers.

The semiconductor structure above, a bit line structure at least partially located in the trench is formed in the trench on the substrate, the bit line structure extends along the first direction, and the bit line structure forms laminated structure together with the top dielectric layer located on the bit line structure, part of sidewalls of the laminated structure on the substrate is covered with the sidewall structure, the first air gap is arranged in the sidewall structure, the isolation pattern structure extending along the second direction is formed in the second direction intersecting the first direction, and the second air gap is arranged in the isolation pattern structure, the capacitance contact hole is formed between adjacent bit line protection structures and adjacent isolation pattern structures, so that the bit line structure and the capacitance contact structure between adjacent bit line structures are separated by the sidewall structure with a first air gap, and the capacitance contact structure and another capacitance contact structure are separated by the isolation pattern structure with the second air gap, and air has good insulation and smaller dielectric coefficient, under the condition that the induced charge effect between the bit line structure and the capacitance contact structure and between the capacitance contact structure and another capacitance contact structure remains unchanged, the size of capacitance contact hole where the capacitance contact structure is located can be further reduced.

The technical features of the above embodiments can be combined arbitrarily. In order to make the description concise, all possible combinations of the technical features of the above embodiments are not described. However, as long as there is no contradiction in the combinations of these technical features, they shall be considered to be the scope recorded in this specification.

The above embodiments only express several embodiments of the present application, and the description is specific and detailed, but it cannot be understood as limiting the scope of the present application. It should be noted that for those skilled in the art, several modifications and improvements can be made without departing from the concept of the present application, all the modifications and improvements belong to the protection scope of the present application. Thereof, the protection scope of the present application shall be subject to the appended claims.

The invention claimed is:

1. A semiconductor structure, comprising:
a substrate;
a trench, located in the substrate;
a bit line contact structure, the bit line contact structure located in the trench, wherein an upper surface of the bit line contact structure is lower than an upper surface of the substrate, the bit line contact structure extends along a first direction;
a bit line structure, the bit line structure located on the bit line contact structure, and at least partially located in the trench;
a bit line protection structure, the bit line protection structure comprising a top dielectric layer and a sidewall structure, wherein the top dielectric layer is located on the bit line structure and forms a laminated structure together with the bit line structure; the sidewall structure covers part of sidewalls of the laminated structure on the substrate, the sidewall structure has a first air gap; and
an isolation pattern structure, wherein the isolation pattern structure has a second air gap, the isolation pattern structure extends along a second direction, the second direction intersects with the first direction, to form a capacitance contact hole between the adjacent bit line protection structures and the adjacent isolation pattern structures.

2. The semiconductor structure according to claim 1, the semiconductor structure further comprises a sidewall protective layer, covering sidewalls of the trench.

3. The semiconductor structure according to claim 2, wherein the bit line contact structure and the bit line structure fill the trench.

4. The semiconductor structure according to claim 3, wherein an upper surface of the bit line structure is flush with the upper surface of the substrate.

5. The semiconductor structure according to claim 4, the sidewall structure further comprises:
a sidewall dielectric layer, located outside part of the sidewalls of the laminated structure on the substrate; the first air gap located between the sidewall dielectric layer and the laminated structure.

6. The semiconductor structure according to claim 1, further comprising:

a capacitance contact structure, the capacitance contact structure located in the capacitance contact hole.

7. The semiconductor structure according to claim 6, wherein, an upper surface of the capacitance contact structure is lower than an upper surface of the top dielectric layer, the semiconductor structure further comprises a conductive filling layer, located on the capacitance contact structure.

8. The semiconductor structure according to claim 1, the isolation pattern structure further comprises:
a first dielectric layer; and
a second dielectric layer, located on opposite sides of the first dielectric layer; wherein the second air gap is located between the first dielectric layer and the second dielectric layer.

9. The semiconductor structure according to claim 1, further comprising:
an isolation dielectric structure, the isolation dielectric structure located between the adjacent bit line protection structures, comprising an isolation dielectric layer and an isolation sidewall structure, wherein the isolation dielectric layer is located on the substrate, the isolation sidewall structure covers sidewalls of the isolation dielectric layer, the isolation sidewall structure has a third air gap, the isolation dielectric structure extends along the first direction, the capacitance contact hole is surrounded by the adjacent bit line protection structure and the isolation dielectric structure and the adjacent isolation pattern structures.

10. A method for manufacturing a semiconductor structure, comprising:
providing a substrate;
forming a trench in the substrate;
forming a bit line contact structure in the trench, an upper surface of the bit line contact structure being lower than an upper surface of the substrate, the bit line contact structure extending along a first direction;
forming a bit line structure on the bit line contact structure, at least part of the bit line structure being located in the trench;
forming a top dielectric layer on the bit line structure, the top dielectric layer forming a laminated structure together with the bit line structure;
forming a sidewall structure, the sidewall structure covering part of sidewalls of the laminated structure on the substrate, the sidewall structure having a first air gap; the sidewall structure and the top dielectric layer forming a bit line protection structure; and
forming an isolation pattern structure, the isolation pattern structure having a second air gap, the isolation pattern structure extending along a second direction, the second direction intersecting with the first direction, a capacitance contact hole being formed between the adjacent bit line protection structures and the adjacent isolation pattern structures.

11. The method for manufacturing the semiconductor structure according to claim 10, wherein before forming a bit line contact structure in the trench, the method further comprises:
forming a sidewall protective layer on sidewalls of the trench.

12. The method for manufacturing the semiconductor structure according to claim 10, wherein a first dielectric layer is formed while the top dielectric layer is formed, the first dielectric layer extends along the second direction;
forming the top dielectric layer and the first dielectric layer comprise:

forming a first dielectric material layer on the substrate; and patterning the first dielectric material layer to form the first dielectric layer and the top dielectric layer.

13. The method for manufacturing the semiconductor structure according to claim 12, wherein the sidewall structure and the isolation pattern structure are formed at the same time, forming the sidewall structure and the isolation pattern structure comprise:

forming a first sacrificial layer on sidewalls of the top dielectric layer, and forming a second sacrificial layer on sidewalls of the first dielectric layer;

forming a sidewall dielectric layer on sidewalls of the first sacrificial layer, and forming a second dielectric layer on sidewalls of the second sacrificial layer; and removing the first sacrificial layer and the second sacrificial layer to form the first air gap and the second air gap;

wherein, the first air gap and the sidewall dielectric layer form the sidewall structure, the first dielectric layer, the second air gap and the second dielectric layer form the isolation pattern structure.

14. The method for manufacturing the semiconductor structure according to claim 10, wherein after forming the sidewall structure and the isolation pattern structure, the method further comprises:

forming a capacitance contact structure in the capacitance contact hole.

15. The method for manufacturing the semiconductor structure according to claim 14, wherein, an upper surface of the capacitance contact structure is lower than an upper surface of the top dielectric layer, after forming the capacitance contact structure, the method further comprises:

forming a conductive filling layer on the capacitance contact structure.

16. The method for manufacturing the semiconductor structure according to claim 10, wherein an upper surface of the bit line structure is flush with the upper surface of the substrate.

* * * * *